United States Patent
Horio et al.

(10) Patent No.: US 6,307,143 B1
(45) Date of Patent: Oct. 23, 2001

(54) THERMOELECTRIC MATERIALS AND THERMOELECTRIC CONVERSION ELEMENT

(75) Inventors: Yuma Horio; Hiroyuki Yamashita; Toshiharu Hoshi, all of Hamamatsu (JP)

(73) Assignee: Yamaha Corporation (JP)

( * ) Notice: Subject to any disclaimer, the term of this patent is extended or adjusted under 35 U.S.C. 154(b) by 0 days.

(21) Appl. No.: 09/420,343

(22) Filed: Oct. 19, 1999

(30) Foreign Application Priority Data

Oct. 22, 1998 (JP) .................................................. 10-301468

(51) Int. Cl.⁷ .................................................. H01L 35/20
(52) U.S. Cl. .......................... 136/240; 136/238; 136/201; 136/203; 136/205
(58) Field of Search ...................................... 136/201, 203, 136/205, 238, 240

(56) References Cited

U.S. PATENT DOCUMENTS 5,726,381    3/1998   Horio et al. .

FOREIGN PATENT DOCUMENTS

| 0369340 | 5/1990 | (EP) . |
| 0476134 | 3/1992 | (EP) . |
| 9-074229 | 7/1997 | (JP) . |
| 10-51037 | 2/1998 | (JP) . |
| 10074984 * | 3/1998 | (JP) . |
| 10-074984 | 3/1998 | (JP) . |
| 10-178219 | 6/1998 | (JP) . |

OTHER PUBLICATIONS

European Search Report (in English) issued Feb. 4, 2000 in a related application.

* cited by examiner

Primary Examiner—Kathryn Gorgos
Assistant Examiner—Thomas H Parsons
(74) Attorney, Agent, or Firm—Ostrolenk, Faber, Gerb & Soffen, LLP

(57) ABSTRACT

Thermoelectric materials having a high performance index and thermoelectric elements are provided. The present thermoelectric materials are constituted by at least one element selected from the group consisting of Bi and Sb, at least one element selected from the group consisting of Te and Se, and, if necessary, at least one element selected from the group consisting of I, Cl, Hg, Br, Ag, and Cu. The long axis of each crystal grain of the thermoelectric material grows in the direction parallel to the pressing direction at the time of press formation, and the aspect ratio D/d of each crystal grain, which represents a ratio between the average crystal grain size along the long axis D to the average crystal grain size along the short axis d, is more than 1.5. The C-plane is oriented parallel to the pressing direction.

20 Claims, 9 Drawing Sheets

THERMOELECTRIC MATERIALS AND THERMOELECTRIC CONVERSION ELEMENT

BACKGROUND OF THE INVENTION

1. Field of the Invention

The present invention relates to thermoelectric conversion elements applied to thermoelectric power generation and to thermoelectric cooling, and thermoelectric materials used for these thermoelectric conversion elements, and particularly relates to thermoelectric materials and thermoelectric conversion elements having improved performance indices.

2. Description of the Related Art

In general, there are two types of the thermoelectric materials, one is a one-directionally solidified material and another is a sintered material. The one directionally solidified materials are produced by the following procedure. The raw materials are placed in a fused silica tube, and the fused silica tube containing the raw materials is sealed by fusing the end of the tube. The sealed tube is inserted in a tubular furnace and the raw materials are melted and the melt is agitated by shaking the tubular furnace. Subsequently, by applying a temperature gradient to the tubular furnace, the melt is solidified while the crystal orientation is maintained. Thereby, the one directionally solidified material, in which the solidified crystal structure grows in one direction, is obtained.

In contrast, the sintered material is obtained by pulverizing coagulated materials and by hot pressing the pulverized material into a solid form. In this case, a crystal direction (a-axis) having low electrical resistance grows in a direction perpendicular to the pressing direction at the time of press forming, so that the thermoelectric elements and a thermoelectric module constituted of a plurality of thermoelectric elements are assembled by attaching electrodes such that the electric current flows in the direction of the a-axis.

FIG. 21 is a schematic diagram showing an arrangement of the crystal grains of the thermoelectric material and the direction of hot-pressing (shown by an arrow). When the thermoelectric material 1 is formed by hot-pressing, the a-axis of the crystal grain 2 grows in the direction perpendicular to the hot pressing direction and the c-axis of the crystal grain grows in the direction parallel to that of the hot-pressing. Since the thermoelectric materials 1 generally have such a structural anisotropy, the a-axis of the crystal grain 2 grows faster than the c-axis. Thereby, the crystal grain 2 grows until a size of a few millimeter, and its aspect ratio becomes more than 5.

However, problems are encountered in the conventional thermoelectric material in that the material has low resistance to mechanical impacts because the crystals constituting the thermoelectric material are weak due to the large crystal size of more than a few milimeters and the tendency to cleavage. In addition, conventional thermoelectric materials generally show high thermal conductivity. The performance index Z of the thermoelectric materials is expressed by the following equation (1), when the Seebeck coefficient is represented as $\alpha(\mu \cdot V/K)$, the specific resistance as $\rho$ ($\Omega \cdot mm$), and the thermal conductivity as $\kappa$ (W/m·K).

$$Z=\alpha^2/\rho \times K; \quad (1)$$

As shown by the equation (1), the performance index Z becomes low when the thermal conductivity is high. That is, the improvement of the performance is limited when the thermal conductivity is high.

In the case of conventional thermoelectric materials, the powder size is the same as that of the crystal grain. In general, the larger the crystal grain size, the higher the thermal conductivity K and the lower the specific resistance $\rho$. The smaller the crystal size, the lower the thermal conductivity $\kappa$, and the larger the specific resistance p. Since the effect of the grain size is smaller in the specific resistance than in the thermal conductivity, it is effective to reduce the grain size of the crystal in order to improve the performance index Z. Conventionally, since the powder size and the grain size of the crystal thermoelectric materials are the same, pulverization of the crystal grains is limited. Moreover, when further pulverization of the crystal grains is executed, the crystal grain surface will be oxidized, and the crystal grain surface is contaminated, which may cause an increase of the specific resistance and a degradation of the performance index.

SUMMARY OF THE INVENTION

The present invention has been carried out to solve the above described problems, and it is therefore an object of the present invention to provide thermoelectric materials and thermoelectric elements having remarkably high performance indices.

According to the first aspect of the present invention, a thermoelectric material comprising: a composition constituted of at least one element selected from the group consisting of Bi and Sb, and at least one element selected from the group consisting of Te and Se; a crystal structure in which a long axis of each crystal grain grows in the pressing direction during forming by pressing; an aspect ratio (D/d) of more than 1.5 which is the ratio of the average crystal grain size along the long axis (D) to the average crystal grain size along the short axis (d) of each crystal grain; the average crystal grain size along the long axis is 30 $\mu$m or less, and the average crystal grain size along the short axis is 10 $\mu$m or less; and the C-plane of each crystal grain is oriented in the pressing direction.

According to the second aspect of the present invention, a thermoelectric material comprising: a composition constituted of at least one element selected from the group consisting of Bi and Sb, at least one element selected from the group consisting of Te and Se, and at least one element selected from the group consisting of I, Cl, Hg, Br, Ag, and Cu; a crystal structure in which a long axis of each crystal grain grows in the pressing direction during forming by pressing; an aspect ratio (D/d) of more than 1.5 which is the ratio of the average crystal grain size along the long axis (D) to the average crystal grain size along the short axis (d) of each crystal grain; the average crystal grain size along the long axis is 30 $\mu$m or less, and the average crystal grain size along the short axis is 10 $\mu$m or less; and the C-plane of each crystal grain is oriented in the pressing direction.

For the thermoelectric materials according to the first and second aspects, when the crystal structure of said thermoelectric material is analyzed by the X-ray diffraction pattern for the planes perpendicular to the pressing direction, it is preferable that the ratio $I_0/I_1$ of a diffraction peak intensity $I_0$ of the crystal plane (110) to that $I_1$ of the crystal plane (015) is more than 0.2; the ratio $I_0/I_2$ of the diffraction peak intensity $I_0$ of the crystal plane (110) to that $I_2$ of the crystal plane (1010) is more than 0.5; and the ratio $I_0/I_3$ of the diffraction peak intensity $I_0$ of the crystal plane (110) to that $I_3$ of the crystal plane (205) is more than 0.5.

According to any one of the first and second aspects, it is preferable that the crystal grains of the thermoelectric materials are formed by recrystallization; that is, thermoelectric materials are formed by (1) pulverizing or without pulverizing the thin foil prepared by a liquid quenching method, (2) pulverizing or without pulverizing the thin foil prepared by a liquid quenching method and subsequent heat-treatment in an inert gas, (3) an heat treatment in an inert gas or in hydrogen after pulverizing the thin foil prepared by a liquid quenching.

Furthermore, the thermoelectric element is characterized in that it is formed by attaching electrodes so that the electric current flows in the direction parallel to the direction of the long axis of the crystal grains.

The grain sizes along the long axis and along the short axis of the thermoelectric materials of the present invention are defined to be less than a specified value, and the aspect ratio D/d of the grain size D along the long axis to the grain side d along the shorts axis is defined to be less than 1.5. In addition, the long axis of each crystal grain grows in the pressing direction at the time of the press forming operation.

The inventors of the present invention have proposed a thermoelectric material with the same composition of (Japanese Patent Application, First Publication No. 10-51037). However, in the thermoelectric material proposed in the previous patent application, it is defined that the average crystal grain size is less than 50 $\mu$m and that the aspect ratio is within a range of 1 to 3. It is noted, however, that, in contrast to the present invention, the short axis grows in the pressing direction and the grain size along the a-axis, which is perpendicular to the c-axis of the pressing direction, is longer than the grain size along the pressing direction, as shown in FIG. 10 and in the paragraph 0032 of the previous application. That is, although the crystal grains in the previous application are made closer to the homaxial crystal grains, the grain size along the a-axis is longer than the grain size along the c-axis which is similar to conventional crystal grains.

The present thermoelectric material is made by changing the method of press forming and thermal treatment, breaking with convention, so as to change the orientation of the long axis to along the pressing direction, that is the C-plane, and so as to be able to obtain an aspect ratio D/d more than 1.5, which results in obtaining superior thermoelectric materials having high performance indices.

The crystal structure of the thermoelectric material of the present invention is hexagonal as shown in FIG. 1. The C-surface of the hexagonal system is shown as a hatched surface in FIG. 1. If the pressing direction at the time of press forming is set in the direction shown by the arrow shown in FIG. 2, the hatched surface in FIG. 2 is the surface to be subjected to the X-ray diffraction analysis. An example of the X-ray diffraction pattern is shown in FIG. 3.

DETAILED DESCRIPTION OF THE INVENTION

Hereinafter, the present invention will be described in more detail.

Figure 7:
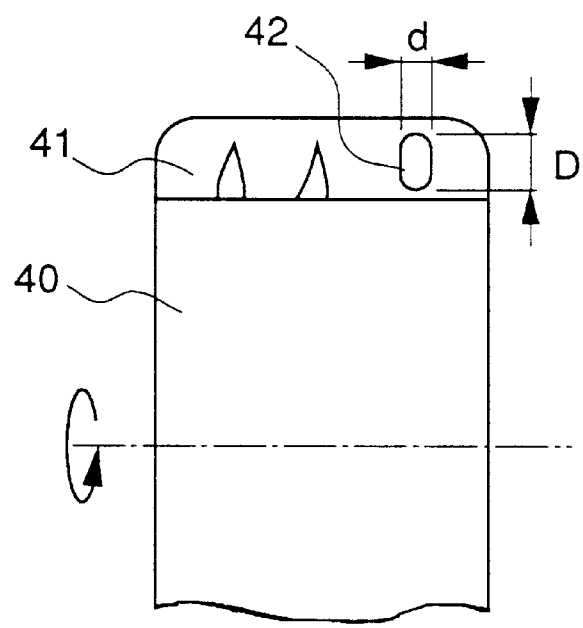
FIG. 7 is a diagram showing the direction of the crystal growth in the quenched foil.
Figure 8:
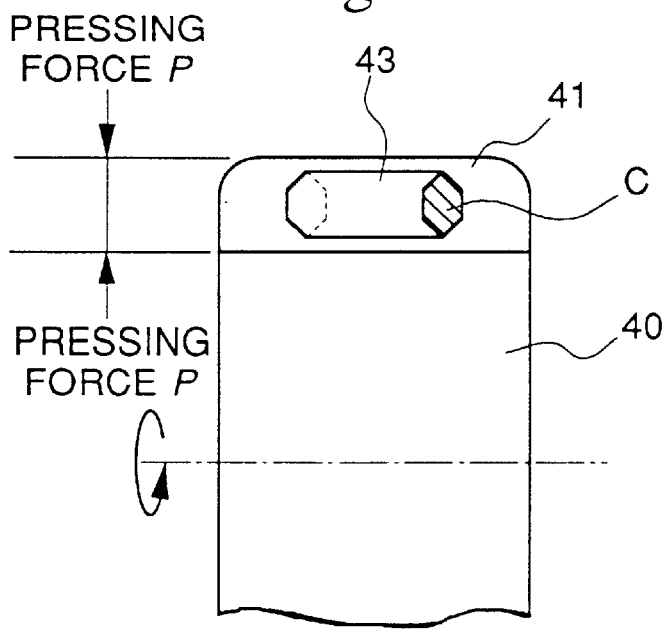
FIG. 8 is a model diagram showing the relationship between the pressing direction and the C-plane.

FIG. 7 is a diagram showing the growth direction of the crystal grains in a foil of thermoelectric material prepared by a liquid quenching method (a single roller method). When a quenched thin foil 41 is formed by quenching the melt of the thermoelectric material on the surface of the cooling roller 40, since the melt is cooled from the surface of the roller, that is, the temperature gradient is formed from the surface of the roller toward the outside, a crystal grain 42 is formed in which the crystal grows in the direction departing from the roller and the long axis of the crystal is oriented in this direction and the short axis is arranged in the direction parallel to the surface of the roller. Consequently, a quenched foil 41 is obtained, in which crystal grains having the long axis oriented along the direction of the foil thickness are arranged. In addition, it is possible to control the crystal orientation of the thermoelectric material by controlling the temperature of the melt at the time of quenching. As shown in FIG. 8, a thermoelectric material can be obtained in which the thickness direction of the quenched foil and the C- plane of the hexagonal crystal are lined up in a direction parallel to the long axis, whereby a crystal structure is obtained in which the C-surface is oriented in the direction of pressing.

It is possible to form a foil of a thermoelectric material by liquid quenching, and in some cases, the thus quenched foil is as fine as pulverized powder. If the foil is not so fine, then the foil is pulverized into powder. The thus obtained powder of the thermoelectric material by liquid quenching often includes a large amount of strain or high density defects in the interior. When this quenched type foil is heat treated in a reduced atmosphere of hydrogen or is subjected to forming by a hot press or an extrusion process, fine recrystallized grains by nuclei of the strain or the defects are formed inside of the powder or foil. The impurity concentration is low at the grain boundary of the crystallized grains, and it is possible to decrease the thermal conductivity by increasing the phonon scattering while maintaining the low specific resistance ($\rho$). Thereby, it is possible to remarkably improve the performance index (Z).

Furthermore, during forming by hot pressing, the crystal grains formed by the use of the strain of the quenched foil can also re-crystallize as crystal grains having a large aspect ratio, in which the long axis of each crystal grain extends in the direction parallel to the pressing direction in the mold pressing process and the short axis extends in the direction perpendicular to the pressing direction. Accordingly, when press forming the quenched foil (powder) containing crystal grain each having oriented long axis along the thickness direction, it is possible to arrange the long axis of each recrystallized crystal grainiin the pressing direction by pressing crystal grains parallel to the long axis of the crystal grain, so that a thermoelectric material is obtained, in which the long axis of crystal grains formed by liquid quenching and by re-crystallization are arranged and oriented in the pressing direction. In this case, since the specific resistance ($\rho$) in the direction of the long axis becomes far lower than the specific resistance ($\rho$) in the direction of the short axis, the performance index in the direction of the long axis increases. When the C-plane is arranged in the pressing direction, the specific resistance in the pressing direction further decreases and the performance index in this direction becomes high. Therefore, when the thermoelectric crystal is assembled as a thermoelectric conversion element, the electrodes should be attached so that an electric current flows in the pressing direction, that is, in the direction of the long axis.

In the present embodiment, although a thermoelectric material is manufactured by the addition of Te to a composition comprising Bi, Sb, and Te, it may be possible to obtain the same effect by use of other various thermoelectric material compositions. For example, in the present invention, it may be possible to use compositions as the thermoelectric material comprising either one or both of Bi and Sb, and either one or both of Te or Se. Materials may be used which contain an additive to the above described composition of at least one element selected from the group consisting of I, Cl, Hg, Br, Ag and Cu.

Figure 1:
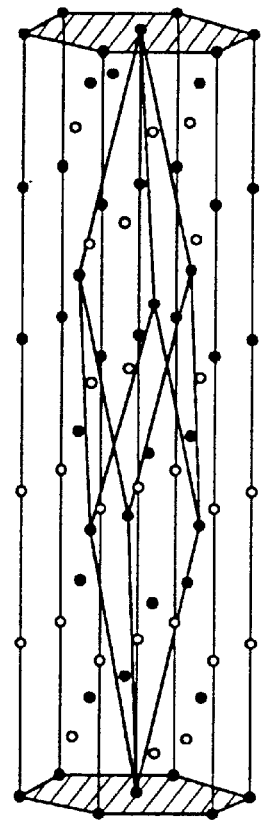
FIG. 1 is a diagram showing a crystal structure of a thermoelectric material of the present invention.
Figure 2:
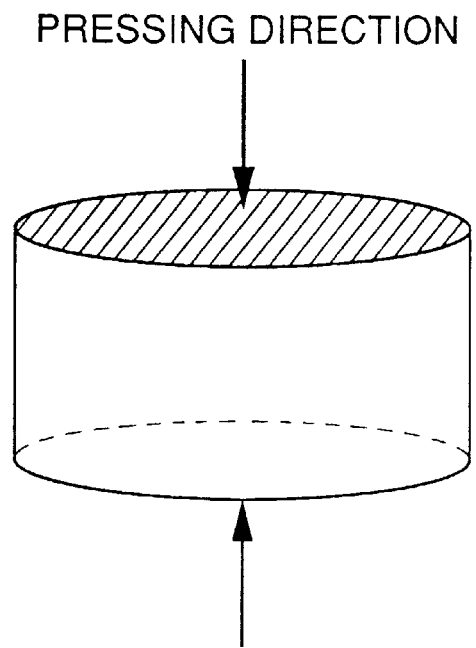
FIG. 2 is a diagram showing the pressing direction.
Figure 3:
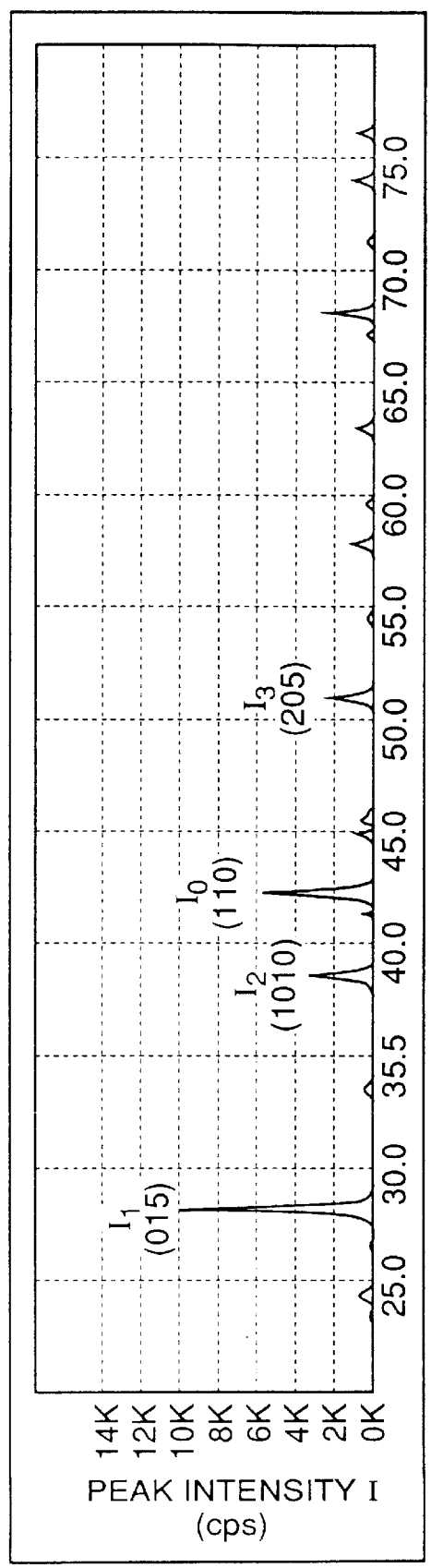
FIG. 3 is a diagram showing an example of analysis by the X-ray diffraction.
Figure 4:
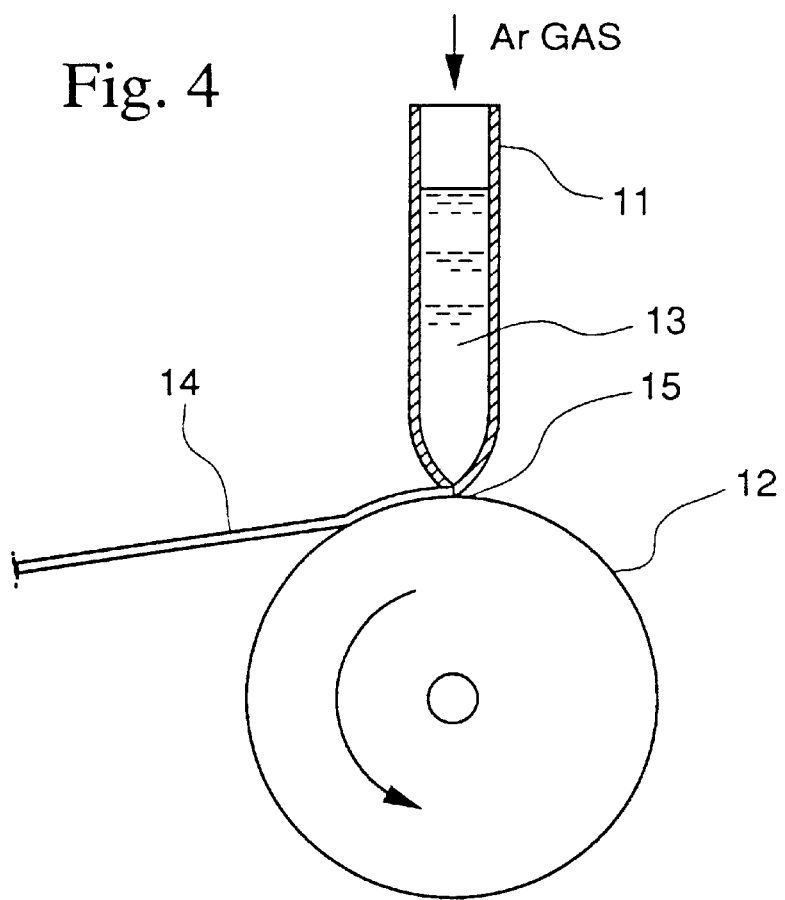
FIG. 4 is a diagram showing a manufacturing process of a thermoelectric material by liquid quenching.

A manufacturing method of the above described thermoelectric materials is now described. FIG. 4 shows a method for manufacturing a powder of a thermoelectric material by a liquid quenching method. While rotating a roller 12 made of copper, a molten thermoelectric material 13 stored in a quartz nozzle 11 is supplied on the top of the roller 11 under pressure by Argon gas. Thereby, the molten thermoelectric material 13 is quenched and is released as a quenched thin band 14 by the rotation of the roller 12.

Figure 5:
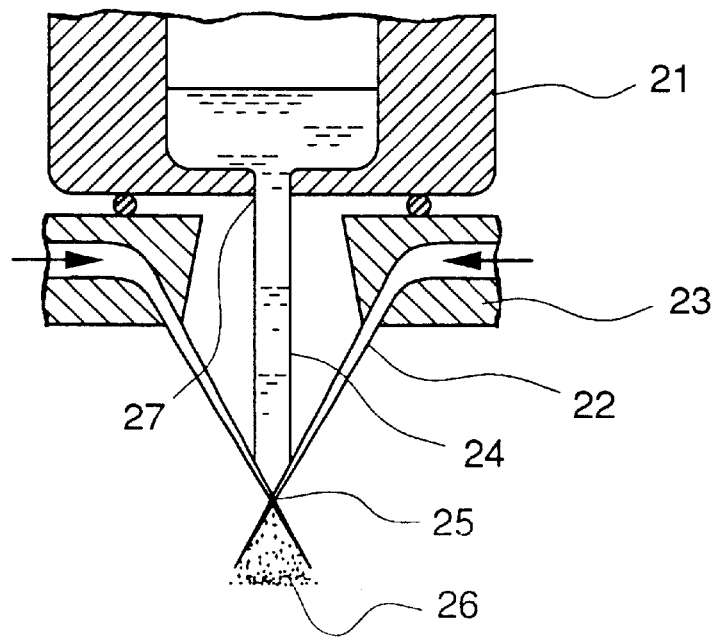
FIG. 5 is a diagram showing a manufacturing process of a thermoelectric material by the gas atomizing method.

FIG. 5 illustrates a method of manufacturing a quenched powder by a gas atomizing method. A crucible 21, in which the molten thermoelectric material is preserved, is provided with a discharge hole 27 for discharging the molten material therefrom. The molten material discharged from the discharge hole 27 flows down, forming a thin stream of the melt. A jet nozzle 23 is suspended under the crucible so as to be able to emit a jet of a stream 22 of a high pressure gas from the jet nozzle 23. Accordingly, the high pressure gas stream 22 crosses the fine melt stream 24 at a powdering point 25 and the melt is quenched and pulverized by the high pressure gas stream 22.

The quenched thin foil belt 14 obtained by the liquid quenching method shown in FIG. 4 or the quenched powder 26 obtained by the gas atomizing method shown in FIG. 5 are then heat treated in hydrogen or Ar gas. The conditions of the heat treatment are, for example, at temperatures in a range of 200 to 500° C. and for 2 to 24 hours.

Figure 6:
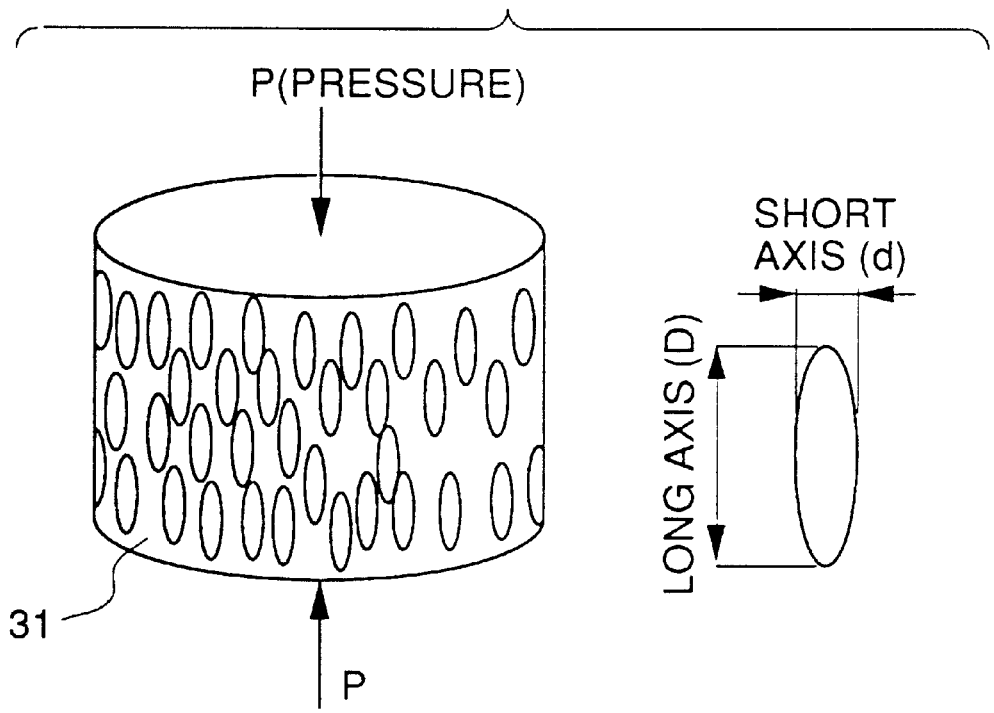
FIG. 6 is a diagram showing a mold forming process by a hot-pressing operation.

Subsequently, the thin foil 14 or the powder 26 are pulverized as necessary and are classified into a sorted grain size. The powder with an appropriate range of grain sizes is charged in a cylindrical mold 31 so as to arrange the long axis of the crystal grain in the powder parallel to the pressing direction as shown in FIG. 6, and the powder is pressed by applying a pressure P in the direction of the longitudinal axis while restraining the circumferential surface during a hot stage. As a result, a thermoelectric material is formed by hot pressing having a crystal system composed of crystals, the long axes of which are parallel to the pressing direction, and the short axes of which are perpendicular to the pressing direction.

In the above process, a thermoelectric material can be obtained, which has an average crystal grain size along the long axis of 30 $\mu$m or less, and an average crystal grain size along of the short axis of 10 $\mu$m or less, and the ratio D/d between the grain sizes along the long axis D and the short axis d is 1.5 or more.

Next, a practical example of the manufacturing conditions is described in detail. First, a molten thermoelectric material with the necessary composition is converted into a thin film or a powder by, for example, a single roller method shown in FIG. 4 with a quenching speed in a range of $10^3$ to $10^6$ K/sec. In order to execute a controlled growing of the crystal orientation having the low specific resistance, the surface temperature of the roller (for example, made of copper) is maintained at 80° C. or less. The thus formed thin film as formed, or the thin film after crushing and sorted into fragments with an average fragment grain size of 50 $\mu$m or is then subjected to hot-pressing. The conditions of the hot pressing are a pressure in a range of 100 to 4000 Kgf/cm², a temperature in a range of 300 to 500° C., and a time of 15 to 180 minutes. The thermoelectric materials with the desired properties can be obtained by the above manufacturing processes.

Furthermore, it is possible to control the C-surface arranged in a fixed direction on the roller surface by maintaining the temperature of the melt at 1000° C or less, and by setting a rotating speed of the roller, for example, 2 to 80 m/s, a diameter of the nozzle, for example, 0.1 to 10 mm, and a pressure applied to the melt, for example, 0.1 to 7 kg/cm² during the quenching process.

EXAMPLE

Figure 9:
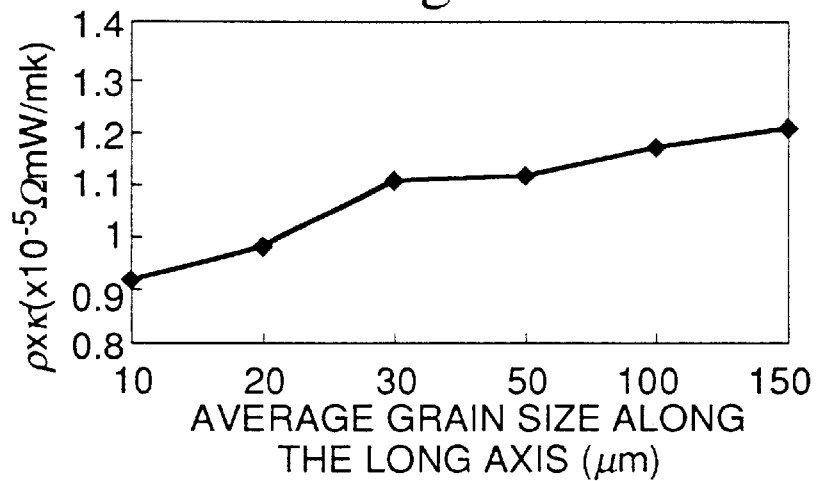
FIG. 9 is a diagram showing the relationship between $\rho \times \kappa$ in the pressing direction and the average crystal grain size in the long axis.

The properties of the thermoelectric material manufactured according to the present invention are compared with those of the other thermoelectric materials which are outside of the scope of the present invention. FIG. 9 shows the relationship between the average crystal grain size of the long axis on the abscissa and the product of the specific resistance ρ and the thermal conductivity κ (this product is inversely proportional to the performance index) on the longitudinal axis. A P-type thermoelectric material having a composition of $Bi_{0.4}Sb_{1.6}Te_3$ with an additive of 5 wt % of Te was used. The Athermoelectric material having this composition was quenched by a liquid quenching method using a single roller. The rotating speed of the roller was 42 m/sec. The thus obtained thin foil was mold formed by hot pressing by applying a pressure of 4 tonf/cm² after heating at a temperature of 380° C. for 30 minutes. It was observed that the obtained crystal grains had an aspect ratio of 4, and the Seebeck coefficient used for calculating the performance index α was 182 to 195 μV/ K.

Figure 10:
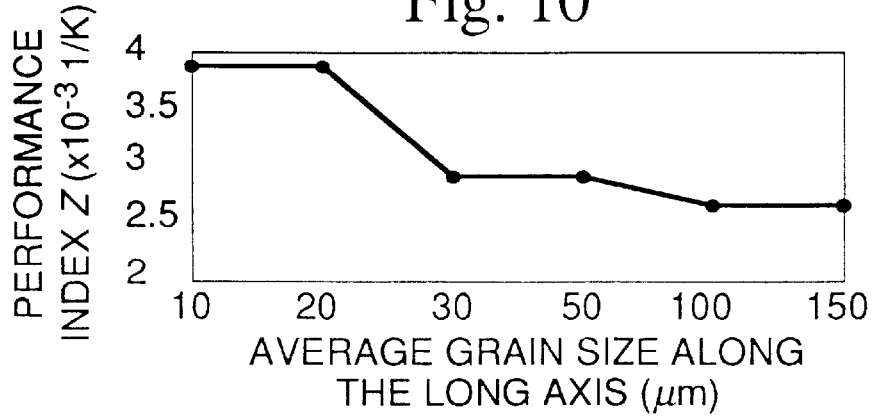
FIG. 10 is a diagram showing the relationship between the performance index Z and the average crystal grain size in the long axis.

As shown in FIG. 9, if the average crystal grain size along the long axis is less than 30 μm, the product of ρ×κ, is low. FIG. 10 shows the relationship between the average crystal grain size along the long axis and the performance index Z. The performance index becomes very high when the average crystal grain size along the long axis is less than 30 μm.

Figure 11:
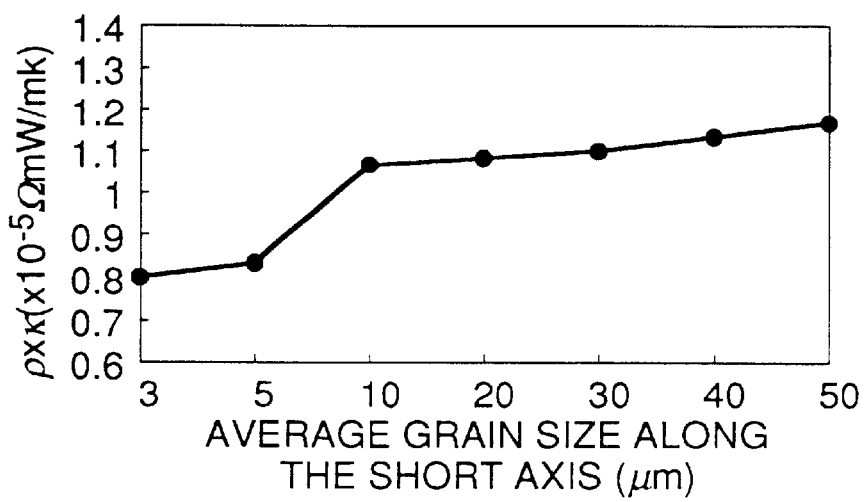
FIG. 11 is a diagram showing the relationship between p x K in the pressing direction and the average crystal grain size in the short axis.

FIG. 11 shows the relationship between the average crystal grain size along the short axis and the value of ρ×κ. In this case, an N-type thermoelectric material is used, which has a composition of $Bi_{1.9}Sb_{0.}Te_{2.85}Se_{0.15}$ with an additive of 0.06 wt % $SbI_3$. The thermoelectric materials having the above composition were obtained by melting and quenching by the liquid quenching method using a single roller. The rotation speed of the roller was 2 m/sec. The thus obtained thin foil was heated at 430° C. for 30 minutes and hot pressed by applying a pressure of 4 tonsf/cm². The aspect ratio of the crystal grains was 3.2. The Seebeck coefficient α used for calculation of the performance index was in a range of −175 to −183 μV/K.

Figure 12:
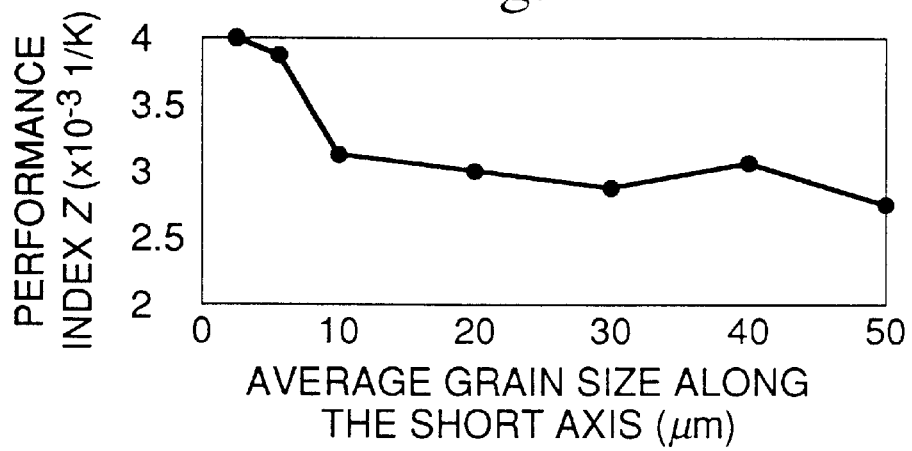
FIG. 12 is a diagram showing the relationship between the performance index Z and the average crystal grain size in the short axis.

As clearly shown in FIG. 11, when the average crystal grain size along the short axis is less than 10 μm, the value of ρ×κ is low. FIG. 12 shows the change of the performance index with the change of the values of ρ×κ, shown in FIG. 11. The performance indices become very high when the average crystal grain size along the short axis is less than 10 μm.

Figure 13:
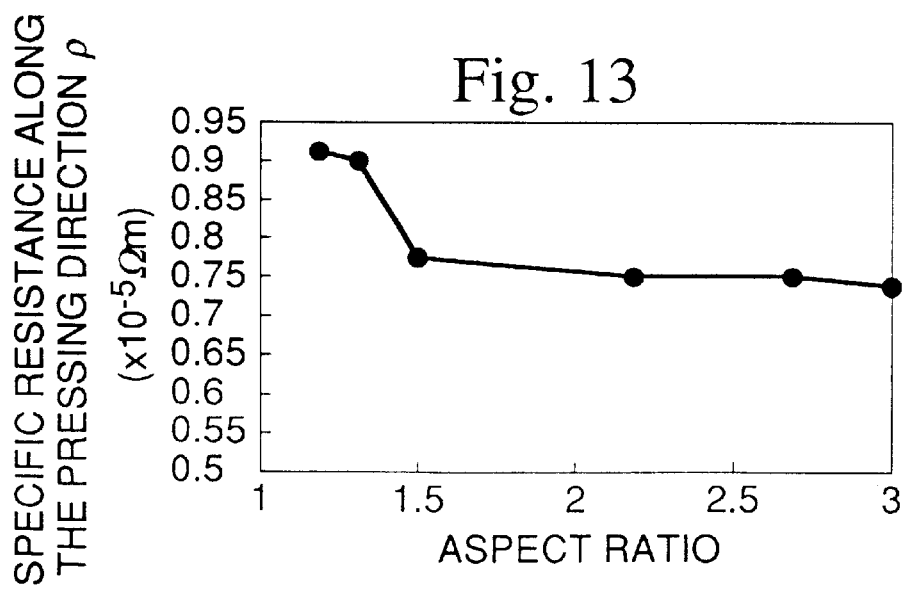
FIG. 13 is a diagram showing the relationship between the specific resistance in the direction of pressing and the aspect ratio of a thermoelectric material.

Next, the effect of the aspect ratio defined by the average crystal grain size along the long and short axes on the performance index of the thermoelectric material will be explained with reference to FIG. 13. FIG. 13 is a diagram showing the relationship between the aspect ratio and the specific resistance P along the pressing direction.

A thermoelectric material having a composition of $Bi_{0.45}Sb_{1.55}Te_3$ with an additive of 1 wt % Te was used. The average crystal grain size along the long axis was in the range of 10 to 30 μm, and the average crystal grain size along the short axis was in a range of 3 to 10 μm. The ratio $I_0/I_1$ of this material was 0.45. As clearly shown in FIG. 13, the specific resistance ρ along the pressing direction decreases when the aspect ratio is more than 1.5. The low specific resistance, as clear from the above equation (1), implies a high performance index.

Figure 14:
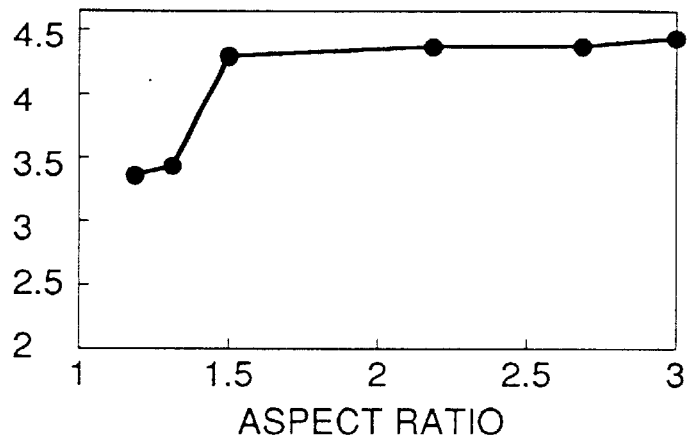
FIG. 14 is a diagram showing the relationship between the performance index in the direction of pressing and the aspect ratio of a thermoelectric material.

FIG. 14 shows the relationship between the aspect ratio shown in FIG. 13 and the performance index. As shown in the previous FIG. 9 and FIG. 14, it is possible to improve the performance index of the thermoelectric material by properly adjusting the aspect ratio and the average crystal grain size.

Figure 15:
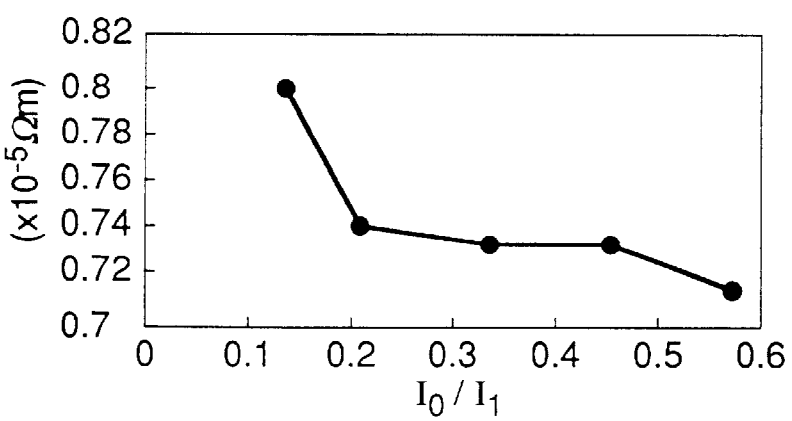
FIG. 15 is a diagram showing the correlation between the specific resistance ($\rho$) and an $I_0/I_1$ ratio of a thermoelectric material having a composition of $Bi_{0.5}Sb_{1.5}Te_3$+1 wt % Te and D/d=4.
Figure 16:
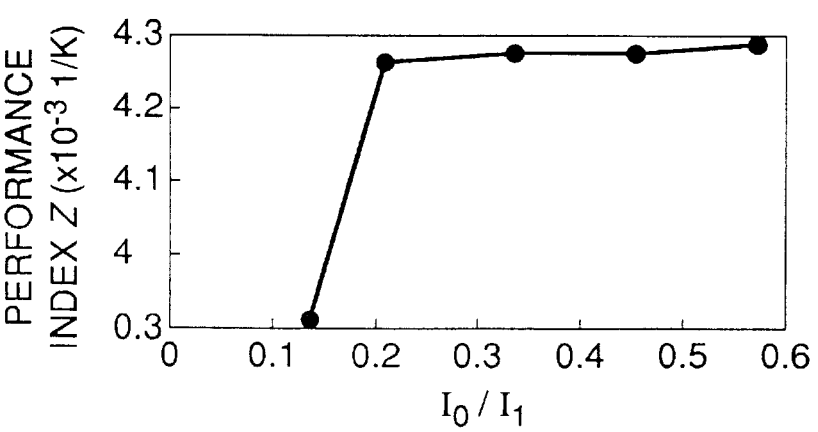
FIG. 16 is a diagram showing the correlation between the performance index (Z) and an $I_0/I_1$ ratio of a thermoelectric material having a composition of $Bi_{0.5}Sb_{0.5}Te_3$ +1 wt % Te and D/d=4.

Next, the crystal structure of the thermoelectric material is described, which is obtained by X-ray diffraction analysis for a surface perpendicular to the pressing direction. FIG. 15 is a diagram showing the relationship between the value of $I_0/I_1$ and the specific resistance (ρ) obtained for a thermoelectric material having a composition of $Bi_{0.5}Sb_{1.5}Te_3$ with an additive of 1 wt % Te, and a ratio D/d=4. FIG. 16 is a diagram showing the relationship between the value of $I_0/I_1$, and the performance index for the above-described thermoelectric material. Here, $I_0$ represents the peak intensity for the crystal plane of (110), and $I_1$ is the peak intensity for the crystal plane of (015). As shown in FIGS. 15 and 16, when the value of IO/ is more than 0.2, the specific resistance shows a remarkable decrease and the performance index Z shows a remarkable increase.

Figure 17:
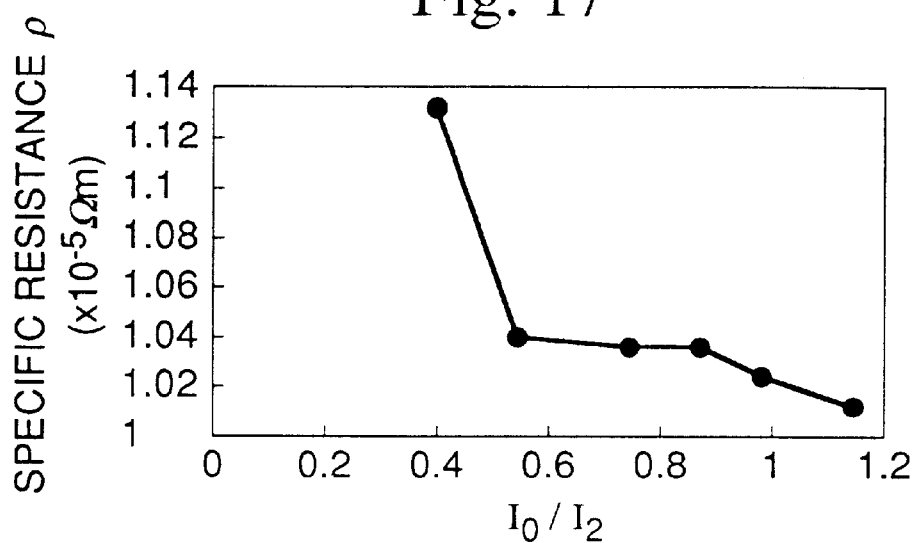
FIG. 17 is a diagram showing the correlation between the specific resistance ($\rho$) and an $I_0I_2$ ratio of a thermoelectric material having a composition of $Bi_{0.4}Sb_{1.6}Te_3$+4 wt % Te and D/d =5.
Figure 18:
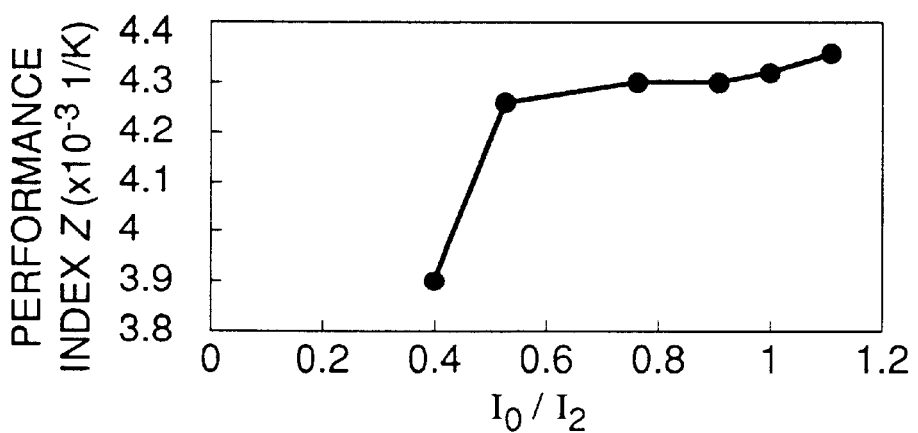
FIG. 18 is a diagram showing the correlation between the performance index Z and an $I_0/I_2$ ratio of a thermoelectric material having a composition of $Bi0.4Sb_{1.6}Te_3$+4 wt % Te and D/d=5.

FIG. 17 is a diagram showing the relationship between the value of $I_1/I_2$ and the specific resistance (ρ) obtained for a thermoelectric material having a composition of $Bi_{0.4}Sb_{1.6}Te_3$ with an additive of 4 wt % Te, and a ratio D/d=5. FIG. 18 is a diagram showing the relationship between the value of $I_0/I_2$ and the performance index for the above-described thermoelectric material. Here, $I_2$ is the peak intensity of the crystal plane of (1010). As shown in FIGS. 17 and 18, when the value of $I_1/I_2$ is more than 0.5, the specific resistance shows a remarkable decrease and the performance index Z shows a remarkable increase.

Figure 19:
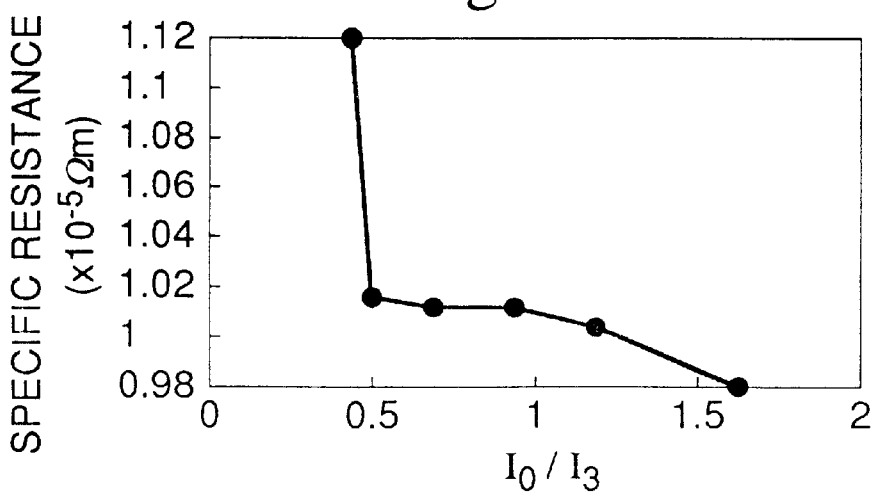
FIG. 19 is a diagram showing the correlation between the specific resistance ($\rho$) and an I13 ratio of a thermoelectric material having a composition of $Bi_{1.9}Sb_{0.1}Te_{2.7}Se_{0.3}$+0.06 wt % $SbI_3$ and D/d=3.2.
Figure 20:
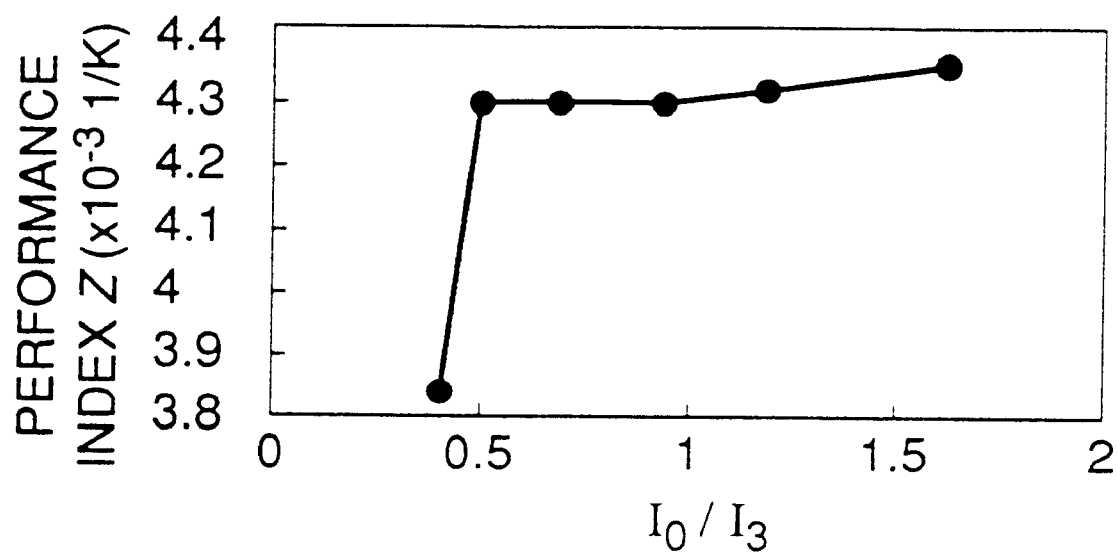
FIG. 20 is a diagram showing the correlation between the performance index Z and an $I_0/I_3$ ratio of a thermoelectric material having a composition of $Bi_{1.9}Sb_{0.1}Te_{2.7}Se_{\cdot 0.3}$+0.06 wt % $SbI_3$ and D/d=3.2.
Figure 21:
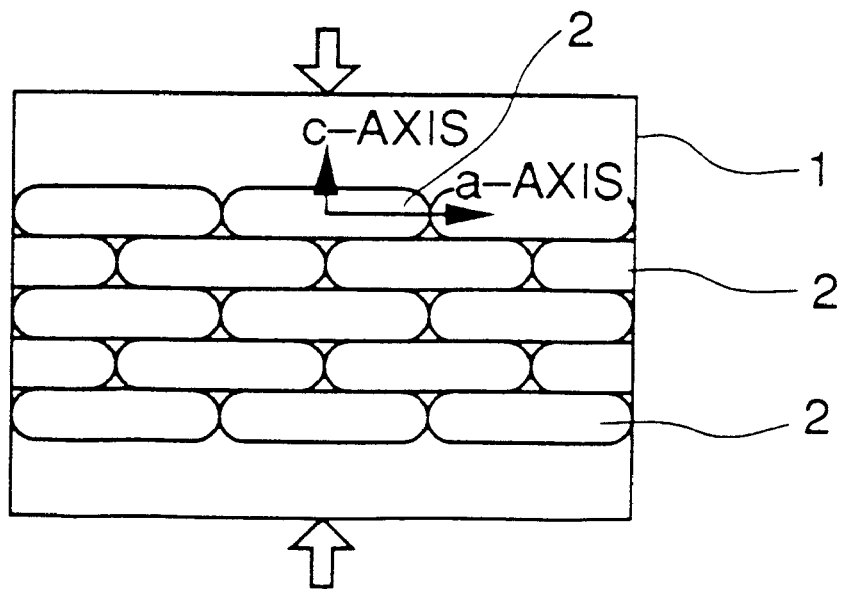
FIG. 21 is a schematic diagram showing a relationship between the direction of hot-pressing and the arrangements of the crystal grains of the thermoelectric material, when formed by the conventional technique.

FIG. 19 is a diagram showing the relationship between the value of $I_0/I_3$ and the specific resistance (ρ) obtained for a thermoelectric material having a composition of $Bi_{1.9}Sb_{0.1}Te_{2.7}Se_{0.3}$ with an additive of 0.06 wt % $SbI_3$, and a ratio D/d=3.2. FIG. 20 is a diagram showing the relationship between the value of $I_0/I_3$ and the performance index for the above-described thermoelectric material. Here, $I_3$ is the peak intensity of the crystal plane of (205). As shown in FIGS. 19 and 20, when the value of $I_0/I_3$ is more than 0.5, the specific resistance shows a remarkable decrease and the performance index Z shows a remarkable increase.

The thermoelectric material of the present invention differs from the previous application not only in the aspect ratio as shown above, but also in the crystal structure that the crystal grains are oriented in the direction of the low specific resistance, so that it becomes possible to improve the performance index by lowering the specific resistance (ρ), while maintaining the thermoelectromotive force (α) and the thermal conductivity (κ) at a fixed value. In the present invention, the thermoelectric material may have the aspect ratio of more than 1.5 and still better performance indices can be obtained. Practically, a performance index Z of $4.2 \times 10^{-3}$ (1/K) was obtained by the present invention.

The thermoelectric properties for various thermoelectric materials manufactured under different conditions are described hereinafter. First, thermoelectric materials having various compositions were manufactured and the average crystal grain size and the aspect ratio of those materials were measured. Subsequently, the specific resistances p and thermal conductivity κ, and the Seebeck coefficients a were measured for samples of those examples and comparative examples. The results of measurements are shown in Tables 1, 2, (examples) and 3 (comparative examples). Table 1 shows the properties of the examples of the present invention, and Table 2 shows the orientation of the crystal planes. Table 3 shows the properties of comparative examples when the orientation of the crystal planes differs from the examples in that $I_0, I_1 < 0.2$, $I_0/I_2 < 0.5$, and $I_0/I_3 < 0.5$.

TABLE 1

| Example | Composition | Av. grain size along Long axis, (μm) | Av. grain size along short axis (μm) | Aspect ratio of the crystal grain | Properties along the pressing direction ||||
|---|---|---|---|---|---|---|---|---|
| | | | | | α (μV/K) | ρ (10⁻³ Ω cm) | κ (W/mK) | Z (10⁻³ 1/K) |
| 1 | $Bi_2Te_3$ + 2 wt % Te | 28 | 7 | 4 | 180 | 0.70 | 1.1 | 4.21 |
| 2 | $Bi_{0.5}Sb_{1.5}Te_3$ | 18 | 3 | 6 | 175 | 0.74 | 0.98 | 4.22 |
| 3 | $Bi_2Te_{2.9}Se_{0.1}$ | 20 | 5 | 4 | 195 | 0.85 | 1.06 | 4.22 |
| 4 | $Bi_{0.4}Sb_{1.6}Te_3$ + 4 wt % Te | 16 | 5 | 3.2 | 203 | 0.99 | 0.95 | 4.38 |
| 5 | $Bi_{1.8}Sb_{0.2}Te_{2.85}Se_{0.15}$ + 0.1 wt % $HgBr_2$ | 30 | 5 | 6 | −199 | 0.95 | 0.96 | 4.34 |
| 6 | $Bi_{1.9}Sb_{0.1}Te_{2.65}Se_{0.35}$ + 0.15 wt % CuI | 21 | 6 | 3.5 | −180 | 0.75 | 1.00 | 4.32 |
| 7 | $Bi_{1.8}Sb_{0.2}Te_{2.85}Se_{0.15}$ + 0.1 wt % $HgCl_2$ | 17 | 4 | 4.3 | −204 | 0.98 | 0.98 | 4.33 |
| 8 | $Bi_{1.9}Sb_{0.1}Te_{2.65}Se_{0.35}$ + 0.12 wt % AgI | 19 | 4.8 | 4 | −199 | 0.85 | 1.08 | 4.31 |
| 9 | $Bi_{0.5}Sb_{1.5}Te_3$ + 2 wt % Te | 16 | 10 | 1.6 | 210 | 1.07 | 0.95 | 4.34 |
| 10 | $Bi_{1.9}Sb_{0.1}Te_{2.5}Se_{0.5}$ + 0.06 wt % $SbI_3$ | 15 | 10 | 1.5 | −203 | 0.98 | 0.98 | 4.29 |

TABLE 2

| Example | composition | Orientation |||
|---|---|---|---|---|
| | | $I_0/I_1$ | $I_0/I_2$ | $I_0/I_3$ |
| 1 | $Bi_2Te_3$ + 2 wt % Te | 0.33 | 0.44 | 0.41 |
| 2 | $Bi_{0.5}Sb_{1.5}Te_3$ | 0.18 | 0.92 | 0.44 |
| 3 | $Bi_2Te_{2.9}Se_{0.1}$ | 0.17 | 0.39 | 0.52 |
| 4 | $Bi_{0.4}Sb_{1.6}Te_3$ + 4 wt % Te | 0.21 | 0.98 | 0.66 |
| 5 | $Bi_{1.8}Sb_{0.2}Te_{2.85}Se_{0.15}$ + 0.1 wt % $HgBr_2$ | 0.21 | 0.43 | 0.41 |
| 6 | $Bi_{1.9}Sb_{0.1}Te_{2.65}Se_{0.35}$ + 0.15 wt % CuI | 0.33 | 0.78 | 1.02 |
| 7 | $Bi_{1.8}Sb_{0.2}Te_{2.85}Se_{0.15}$ + 0.1 wt % $HgCl_2$ | 0.34 | 0.97 | 0.98 |
| 8 | $Bi_{1.9}Sb_{0.1}Te_{2.65}Se_{0.35}$ + 0.12 wt % AgI | 0.28 | 1.01 | 0.72 |
| 9 | $Bi_{0.5}Sb_{1.5}Te_3$ + 2 wt % Te | 0.41 | 0.95 | 0.33 |
| 10 | $Bi_{1.9}Sb_{0.1}Te_{2.5}Se_{0.5}$ + 0.06 wt % $SbI_3$ | 0.72 | 0.31 | 0.41 |

As shown in Table 1, examples 1 to 10, which fulfill the conditions defined in claims 1 and 2 in the scope of the present invention, showed performance indices Z of 4.21× $10^{-3}$ (1/K) or more, which are practically quite high. In contrast, the comparative examples 11 to 18, which are outside of the scope of the present invention, showed less than 3.46×$10^{-3}$ (1/K), which is less than those of the present invention. The comparative examples, for which the average crystal grain sizes along the long axis as well as the short axis are less than 50 μm, are within the scope of the previous invention disclosed in Japanese Patent Application, First Application No. Hei 10-51037. The performance indices Z of these comparative examples within the scope of the previous application showed preferable values exceeding 3.4×$10^{-3}$ (1/K), although the values are not more preferable than the 4.21×$10^{-3}$ (1/K) which is obtained in the present invention.

The performances of Peltier elements (thermoelectric elements) produced by the use of the thermoelectric materials can be represented by the maximum temperature difference (ΔTmax) and the maximum quantity of heat absorption. When a thermoelectric material having a performance

TABLE 3

| Comparative Example | Composition | Av. grain size along long axis (μm) | Av. grain size along short axis (μm) | aspect ratio of the crystal grain | Properties along the pressing direction ||||
|---|---|---|---|---|---|---|---|---|
| | | | | | α (μV/K) | ρ (10⁻³ Ω cm) | κ (W/mK) | Z (10⁻³ 1/K) |
| 11 | $Bi_2Te_3$ + 2 wt % Te | 54 | 7 | 6 | 179 | 0.84 | 1.51 | 2.53 |
| 12 | $Bi_{0.5}Sb_{1.5}Te_3$ | 18 | 16 | 1.13 | 185 | 0.87 | 1.15 | 3.42 |
| 13 | $Bi_2Te_{2.9}Se_{0.1}$ | 6 | 5 | 1.2 | 198 | 1.28 | 0.89 | 3.44 |
| 14 | $Bi_{0.4}Sb_{1.6}Te_3$ + 4 wt % Te | 16 | 10 | 1.6 | 205 | 1.25 | 0.98 | 3.43 |
| 15 | $Bi_{1.8}Sb_{0.2}Te_{2.85}Se_{0.15}$ + 0.1 wt % $HgBr_2$ | 52 | 5 | 10.4 | −185 | 1.01 | 1.42 | 2.39 |
| 16 | $Bi_{1.9}Sb_{0.1}Te_{2.65}Se_{0.35}$ + 0.15 wt % CuI | 21 | 18 | 1.2 | −198 | 1.01 | 1.12 | 3.46 |
| 17 | $Bi_{1.8}Sb_{0.2}Te_{2.85}Se_{0.15}$ + 0.1 wt % $HgCl_2$ | 8 | 5 | 1.6 | −212 | 1.5 | 0.88 | 3.4 |
| 18 | $Bi_{1.9}Sb_{0.1}Te_{2.65}Se_{0.35}$ + 0.12 wt % AgI | 19 | 15 | 1.2 | −203 | 1.23 | 0.97 | 3.45 | index of, for example, $3.4 \times 10^{-3}$ (IK) is used, the thermoelectric element may show a maximum temperature difference ($\Delta T max$) of more than 70 (K), and a maximum quantity of heat absorption of more than 8 (W/cm). These values imply that, in the case of setting a temperature difference of 10 (K), the thermoelectric element using the above-described thermoelectric material of the present invention can be operated at an electric power consumption reduced by 30% compared to a conventional thermoelectric element. As a result, the thermoelectric element of the present invention can be favorably utilized for the cooling of CCDs, controlling the temperature of the semiconductor devices, and cooling of highly integrated CPUs in order to prevent malfunctions of those electronic devices, and the thermoelectric element of the present invention contributes to a reduction of the electrical power consumption of these electronic devices.

When the performance index exceeds $3.8 \times 10^{-3}$ (1/K), the thermoelectric element is provided with a $\Delta T max$ of more than 75 (K), and a maximum quantity of heat absorption of more than 10 W/cm². When the temperature difference of 10 K from room temperature is set, the electric power consumption of the thermoelectric element of the present invention can be reduced by 38 to 40% compared to a conventional thermoelectric element. This performance of the thermoelectric element of the present invention makes it possible to provide a small electronic cooling-type freezer.

When the performance index exceeds $4.2 \times 10^{-3}$ (1/K), the thermoelectric element is provided with a $\Delta$ Tmax of more than 80 (K), and a maximum quantity of heat absorption of more than 13 W/cm². When a temperature difference of 10 K from room temperature is set, the electric power consumption of the thermoelectric element of the present invention can be reduced by 42 to 45% compared to a conventional thermoelectric element. This performance of the thermoelectric element of the present invention makes it possible to provide a medium sized electronic cooling-type refrigerator with an inner volume of around 100 liters.

As described before, the present invention has the effect of providing a thermoelectric material having a quite high performance index of $4.21 \times 10^{-3}$ (1/K) by controlling the average crystal grain sizes along the long axis and the short axis, and the aspect ratio of each crystal grain. Furthermore, the thermoelectric element using the above-described thermoelectric material exhibits superior thermoelectric performance by mounting electrodes so that the electric current flows in the direction of the long axis of each crystal grain constituting the thermoelectric material of the present invention.

What is claimed is:

1. A thermoelectric material comprising:
   a composition constituted of at least one element selected from the group consisting of Bi and Sb, and at least one element selected from the group consisting of Te and Se;
   wherein the thermoelectric material having:
   a crystal structure composed of a plurality of crystal grains in which the average crystal grain size along the long axis (D) is 30 μm or less, the average crystal grain size along the short axis (d) is 10 μm or less, an aspect ratio (D/d) is more than 1.5, and the long axis extending in the direction of the c-axis of each crystal grain is arranged in parallel to one direction of the thermoelectric material.

2. A thermoelectric material according to claim 1 comprising:
   a composition constituted of at least one element selected from the group consisting of Bi and Sb, at least one element selected from the group consisting of Te and Se, and at least one element selected from the group consisting of I, Cl, Hg, Br, Ag, and Cu.

3. A thermoelectric material according to claim 1, wherein, a ratio $I_0/I_1$ of a diffraction peak intensity $I_0$ of the crystal plane (110) to that $I_1$ of the crystal plane (015) is more than 0.2, when the crystal structure of said thermoelectric material is analyzed by the X-ray diffraction pattern for the planes perpendicular to the pressing direction.

4. A thermoelectric material according to claim 1, wherein, a ratio $I_0/I_2$ of the diffraction peak intensity $I_0$ of the crystal plane (110) to that $I_2$ of the crystal plane (1010) is more than 0.5, when the crystal structure of said thermoelectric material is analyzed by the X-ray diffraction pattern for the planes perpendicular to the pressing direction.

5. A thermoelectric material according to claim 1, wherein, a ratio $I_0/I_3$ of the diffraction peak intensity $I_0$ of the crystal plane (110) to that $I_3$ of the crystal plane (205) is more than 0.5, when the crystal structure of said thermoelectric material is analyzed by the X-ray diffraction pattern for the planes perpendicular to the pressing direction.

6. A thermoelectric material according to claim 1, wherein said crystal grains are formed by recrystallization.

7. A thermoelectric material according to claim 1, wherein said thermoelectric material is obtained by press forming thin sections thereof prepared by a liquid quenching method.

8. A thermoelectric material according to claim 7, wherein said thermoelectric material is obtained by press forming the powder thereof prepared by pulverizing the thin sections formed by a liquid quenching method.

9. A thermoelectric material according to claim 7, wherein said thermoelectric material is obtained by press forming the thin sections thereof prepared by a liquid quenching method and subsequent heat-treatment in an inert gas or in hydrogen.

10. A thermoelectric material according to claim 7, wherein the pressing direction during press forming is parallel to the long axis of the crystal grains constituting the thin sections.

11. A thermoelectric conversion element made of a thermoelectric material comprising:
    a composition constituted of at least one element selected from the group consisting of Bi and Sb, and at least one element selected from the group consisting of Te and Se; wherein the thermoelectric material having:
    a crystal structure composed of a plurality of crystal grains in which the average crystal grain size along the long axis (D) is 30 μm or less, the average crystal grain size along the short axis (d) is 10 μm or less, an aspect ratio (D/d) is more than 1.5 and the long axis extending in the direction of the c-axis of each crystal grain is arranged in parallel to one direction of the thermoelectric material.

12. A thermoelectric conversion element made of a thermoelectric material according to claim 11 comprising:
    a composition constituted of at least one element selected from the group consisting of Bi and Sb, and at least one element selected from the group consisting of Te and Se, and at least one element selected from the group consisting of I, Cl, Hg, Br, Ag, and Cu.

13. A thermoelectric conversion element made of a thermoelectric material according to claim 11 wherein, a ratio $I_0/I_1$ of a diffraction peak intensity $I_0$ of the crystal plane (110) to that $I_1$ of the crystal plane (015) is more than 0.2, when the crystal structure of said thermoelectric material is analyzed by the X-ray diffraction pattern for the planes perpendicular to the pressing direction.

14. A thermoelectric conversion element made of a thermoelectric material according to claims 11, wherein, a ratio $I_0/I_2$ of the diffraction peak intensity $I_0$ of the crystal plane (110) to that $I_2$ of the crystal plane (1010) is more than 0.5, when the crystal structure of said thermoelectric material is analyzed by the X-ray diffraction pattern for the planes perpendicular to the pressing direction.

15. A thermoelectric conversion element made of a thermoelectric material according to claim 11, wherein a ratio $I_0/I_3$ of the diffraction peak intensity $I_0$ of the crystal plane (110) to that $I_3$ of the crystal plane (205) is more than 0.5, when the crystal structure of said thermoelectric material is analyzed by the X-ray diffraction pattern for the planes perpendicular to the pressing direction.

16. A thermoelectric conversion element made of a thermoelectric material according to claim 11, wherein the thermoelectric conversion element is formed so that the electric current flows in the direction parallel to the direction of the long axis of the crystal grains.

17. A thermoelectric conversion element made of a thermoelectric material according to claim 11, wherein said thermoelectric material is obtained by press forming of a thin film prepared by a liquid quenching method.

18. A thermoelectric conversion elements made of a thermoelectric material according to claim 17, wherein said thermoelectric material is obtained by press forming of the powder thereof prepared by pulverizing sections of the thin film formed by a liquid quenching method.

19. A thermoelectric element made of a thermoelectric material according to claim 11 wherein said thermoelectric material is obtained by press forming sections of the thin film prepared by a liquid quenching method and subsequent heat treatment in an inert gas or hydrogen.

20. A thermoelectric conversion element made of a thermoelectric material according to claim 17, wherein the pressing direction is parallel to the direction of the long axis of the crystal grains included in sections of the thin film of the thermoelectric material.

* * * * *